US012565698B2

(12) United States Patent
Haymore et al.

(10) Patent No.: US 12,565,698 B2
(45) Date of Patent: Mar. 3, 2026

(54) METHOD OF OPERATING A PVD APPARATUS

(71) Applicant: SPTS Technologies Limited, Newport (GB)

(72) Inventors: Scott Haymore, Newport (GB); Tony Wilby, Newport (GB); Stephen Burgess, Newport (GB)

(73) Assignee: SPTS Technologies Limited, Newport (GB)

( * ) Notice: Subject to any disclaimer, the term of this patent is extended or adjusted under 35 U.S.C. 154(b) by 334 days.

(21) Appl. No.: 17/958,390

(22) Filed: Oct. 1, 2022

(65) Prior Publication Data

US 2023/0212736 A1 Jul. 6, 2023

(30) Foreign Application Priority Data

Dec. 31, 2021 (GB) ..................................... 2119151

(51) Int. Cl.
| | |
|---|---|
| *C23C 14/02* | (2006.01) |
| *C23C 14/35* | (2006.01) |
| *C23C 14/56* | (2006.01) |
| *H01J 37/34* | (2006.01) |

(52) U.S. Cl.
CPC .......... *C23C 14/566* (2013.01); *C23C 14/021* (2013.01); *C23C 14/35* (2013.01); *H01J 37/3405* (2013.01); *H01J 37/3447* (2013.01); *H01J 2237/3322* (2013.01); *H01J 2237/3343* (2013.01); *H01J 2237/335* (2013.01)

(58) Field of Classification Search
None
See application file for complete search history.

(56) References Cited

U.S. PATENT DOCUMENTS

| | | | |
|---|---|---|---|
| 5,772,858 | A | 6/1998 | Tepman |
| 5,807,467 | A | 9/1998 | Givens et al. |
| 6,132,805 | A | 10/2000 | Moslehi |
| 6,929,724 | B2 | 8/2005 | Green et al. |
| 11,049,761 | B2 | 6/2021 | Brown et al. |

(Continued)

FOREIGN PATENT DOCUMENTS

| | | | | |
|---|---|---|---|---|
| FR | 2895208 | A1 * | 6/2007 | ........ H01J 37/32091 |
| GB | 1391842 | | 4/1975 | |

OTHER PUBLICATIONS

IPO, Search Report for GB2119151.5, Jun. 14, 2022.

*Primary Examiner* — Jason Berman
(74) *Attorney, Agent, or Firm* — Hodgson Russ LLP

(57) ABSTRACT

A PVD apparatus can be operated in a cleaning mode to remove material from an electrically conductive feature formed on a semiconductor substrate. The semiconductor substrate with the electrically conductive feature formed thereon is positioned on a substrate support in a chamber of the PVD apparatus. A shutter is deployed within the chamber to divide the chamber into a first compartment in which the semiconductor substrate and the substrate support are positioned, and a second compartment in which a target of the PVD apparatus is positioned. A first plasma is generated in the first compartment to remove material from the electrically conductive feature and a second plasma is simultaneously generated in the second compartment to clean the target.

21 Claims, 9 Drawing Sheets

(56) References Cited

U.S. PATENT DOCUMENTS

| | | | |
|---|---|---|---|
| 2003/0032207 A1* | 2/2003 | Rengarajan | H01J 37/32935 |
| | | | 324/758.01 |
| 2013/0327635 A1* | 12/2013 | Kawashita | H01J 23/02 |
| | | | 204/192.12 |
| 2014/0020629 A1* | 1/2014 | Tsai | H01J 37/3447 |
| | | | 118/728 |
| 2018/0090460 A1* | 3/2018 | Chu | C23C 14/34 |
| 2019/0348264 A1 | 11/2019 | Tsai et al. | |
| 2021/0074552 A1 | 3/2021 | Kang et al. | |

* cited by examiner

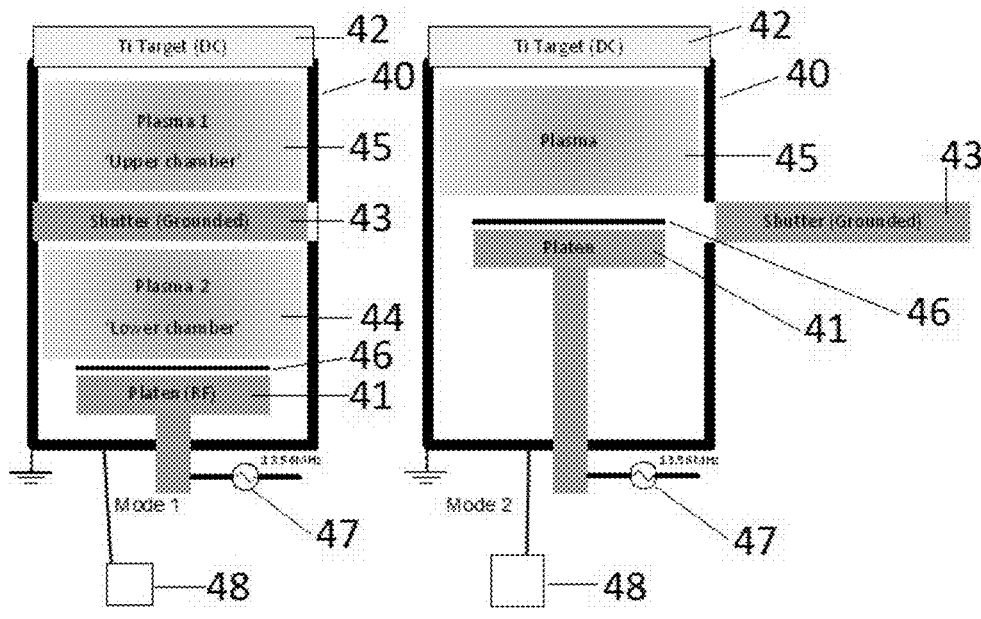
Fig.4a                                    Fig.4b
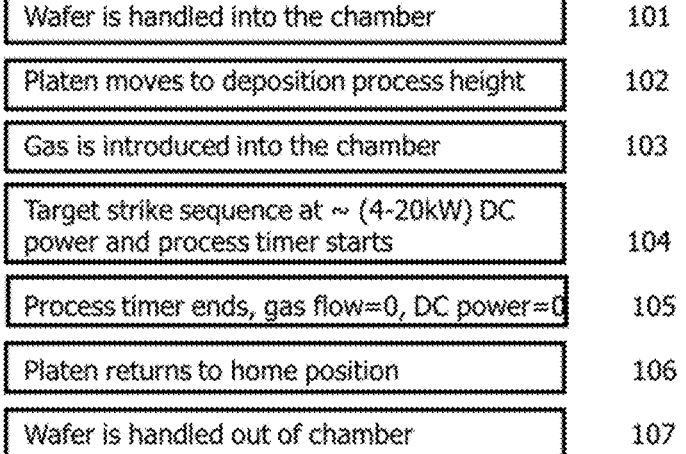
| | |
|---|---|
| Wafer is handled into the chamber | 101 |
| Platen moves to deposition process height | 102 |
| Gas is introduced into the chamber | 103 |
| Target strike sequence at ~ (4-20kW) DC power and process timer starts | 104 |
| Process timer ends, gas flow=0, DC power=0 | 105 |
| Platen returns to home position | 106 |
| Wafer is handled out of chamber | 107 |
Fig.5

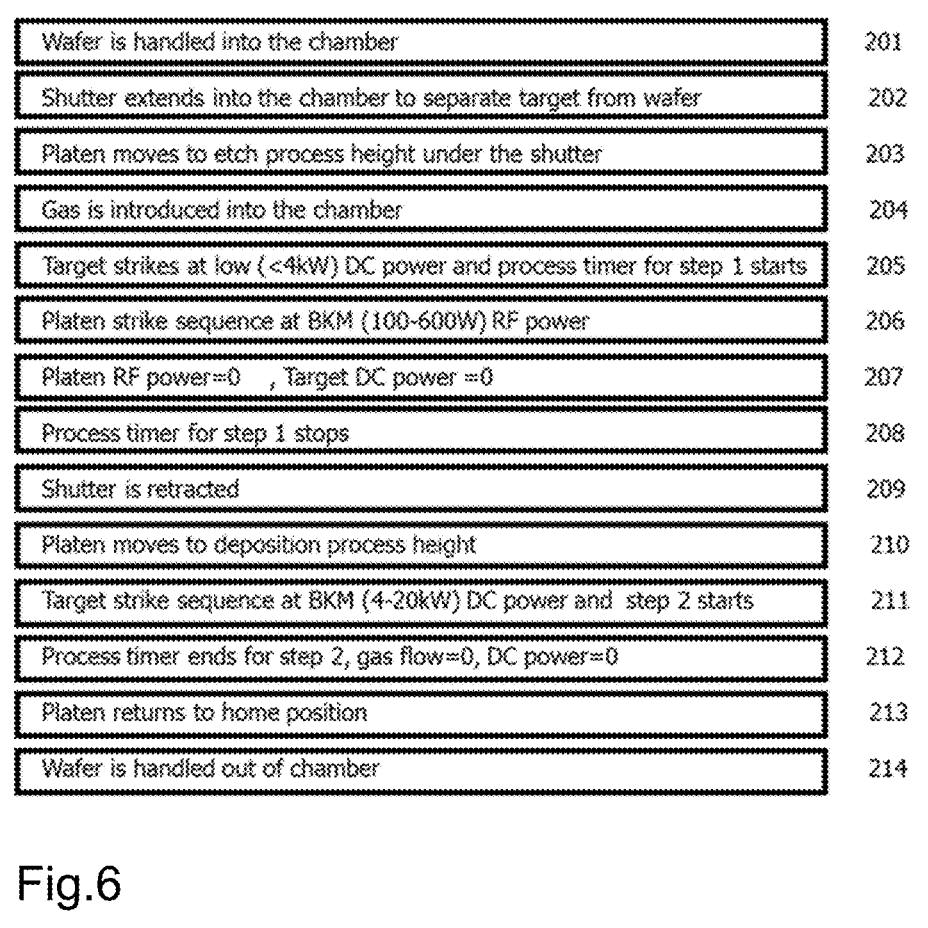

| | |
|---|---|
| Wafer is handled into the chamber | 201 |
| Shutter extends into the chamber to separate target from wafer | 202 |
| Platen moves to etch process height under the shutter | 203 |
| Gas is introduced into the chamber | 204 |
| Target strikes at low (<4kW) DC power and process timer for step 1 starts | 205 |
| Platen strike sequence at BKM (100-600W) RF power | 206 |
| Platen RF power=0   , Target DC power =0 | 207 |
| Process timer for step 1 stops | 208 |
| Shutter is retracted | 209 |
| Platen moves to deposition process height | 210 |
| Target strike sequence at BKM (4-20kW) DC power and  step 2 starts | 211 |
| Process timer ends for step 2, gas flow=0, DC power=0 | 212 |
| Platen returns to home position | 213 |
| Wafer is handled out of chamber | 214 |

Fig.6

METHOD OF OPERATING A PVD APPARATUS

CROSS-REFERENCE TO RELATED APPLICATIONS

This application claims priority to the UK App. No. 2119151.5 filed Dec. 31, 2021, the disclosure of which is hereby incorporated by reference.

FIELD OF THE DISCLOSURE

This invention relates to a method of operating a PVD apparatus, with particular reference to a method of operating a PVD apparatus in a cleaning mode to remove material from an electrically conductive feature formed on a semiconductor substrate The invention relates also to an associated PVD apparatus capable of operating in a cleaning mode.

BACKGROUND OF THE DISCLOSURE

Advanced packaging technologies are a vitally important part of semiconductor fabrication processes, and play a key role in driving miniaturization of devices. As devices continue to shrink in size and contacts increase in density, Back end of line (BEOL) processing is receiving increased attention due to the desire that devices continue to shrink in size and contacts increase in density. Improvements in BEOL processing represent a potential route to increased device efficiency.

A key aspect of BEOL processing is the creation of a low resistance contact on the packaging side of a wafer at the interface between aluminium pads and titanium under bump metallization (UBM) layers prior to bump formation.

Before deposition of Ti—Cu contact layers, the wafers need to be patterned. This process results in the aluminium pads being exposed to atmosphere and thus oxidized. This electrically resistive oxide layer must be removed prior to the deposition of the Ti layer for a good electrical contact to be formed. The removal of the oxide layer is achieved by sputter etching the Al pads in a pre-cleaning (sputter etch) module, after which the wafer is transferred under vacuum to a Physical Vapor Deposition (PVD) chamber, where deposition of Ti is performed.

FIG. 1 is a schematic diagram showing a conventional prior art PVD cluster tool of the type used to perform UBM metallization processes. Wafers are loaded into cassettes or Front Opening Unified Pods (FOUPs) and placed in vacuum cassette elevators (VCEs) or equipment front end modules (EFEMs) 1 for processing. The wafers are transferred through slot valves or load locks to enter a transport module 2 which operates under vacuum. In a typical metal contact application, the wafer is degassed in a pre-heat station 3 where volatile materials are removed from the wafer and the wafer will be brought close to the required temperature. The wafer is then moved to the sputter etch (pre-cleaning) module 4 where a plasma is used to sputter clean the wafer using an inert gas such as Ar and or He. In this step AlOx is removed from the open aluminium bond pads. Once the sputter clean step is complete, the chamber returns to base pressure and the wafer 5 is transferred to a PVD deposition module 7. Movement of the wafer within the transport module is achieved through the use of a vacuum robot 6. As is well understood in the art, PVD deposition onto the wafer is typically accomplished by applying a negative DC voltage to a target in the presence of an inert gas such as Ar at low pressure (typically about 1-100 mTorr) to sputter target material onto the wafer surface. However, the skilled reader will appreciate that sputtering can be achieved using other well-known variations of the basic PVD methodology. Commercial production tools can have number of pre-heat, sputter etch (pre-cleaning) and PVD deposition modules. As the pre-cleaned aluminium surface is very reactive, exposure to any oxygen containing gases will rapidly result in regrowth of an AlOx layer on the Al bond pad. FIG. 2*a* shows process sequence for a standard prior art process in which a degas step 20 is followed by the pre-clean sputter etch step 21. Then, PVD deposition 22 of a titanium adhesion/barrier layer is followed by PVD deposition 23 of a copper seed layer. It has been found that typically it can take 30 s between the end of the pre-clean sputter etch step 21 and the beginning of the titanium PVD deposition step 22.

Patterning of the aluminium bond pads is typically accomplished using an organic polymer mask, such as a polyimide mask. Unfortunately, this gives rise to a significant problem. More specifically, the act of etching the wafer in the pre-cleaning module not only clears the thin oxide layer from the Al pads but also causes a breakdown in the patterned organic polymer mask layer, which releases oxidizing species, such as CO, into the pre-cleaning (etch) module. This process is depicted in FIG. 3, which shows an aluminium bondpad 30 on a passivation layer 32. The aluminium bondpad is masked by a polyimide mask 34. Sputtering by argon ions 36 produces oxidizing species such as CO 38. Even under the most favourable circumstances, the time taken to transfer the wafer between the pre-cleaning (etch) module and the deposition chamber (which as noted above is typically around 30 s) is more than sufficient for the oxidizing species released through sputter etching of the mask during pre-cleaning to react with the Al surface. This results in the regrowth of a thin oxide layer on exposed Al pads within a few seconds. Minimizing the thickness of this regrown oxide layer is key to minimizing the contact resistance.

In traditional PVD systems used for UBM, this problem has been controlled by extended high temperature degassing of the wafer before etching to remove gaseous impurities, by careful control of wafer temperature during the etch process to minimize polymer breakdown, and by reducing the transfer time between etch and deposition chambers. However, these approaches are inherently capable only of ameliorating the problem of the regrown oxide layer on the wafer. None of these approaches are capable of removing an oxide layer which has regrown following treatment in the pre-cleaning module.

Therefore, what is required is an improved processing method which can further reducing contact resistance without reducing system productivity. The present invention, in at least some of its embodiments, addresses the above described problems, desires and requirements. In particular, the present invention, in at least some of its embodiments, provides a way of partially or completely removing regrown oxide layers of the type described above. Although the invention provides particular advantages in the metallization of aluminium, the invention is not limited to these applications, and instead finds more general application in the removal of resistive layers from metallic features prior to metallization by PVD.

BRIEF SUMMARY OF THE DISCLOSURE

According to a first aspect of the invention there is provided a method of operating a PVD apparatus in a cleaning mode to remove material from an electrically conductive feature formed on a semiconductor substrate comprising the steps of:

positioning the semiconductor substrate with the electrically conductive feature formed thereon on a substrate support in a chamber of the PVD apparatus;

deploying a shutter within the chamber to divide the chamber into a first compartment in which the semiconductor substrate and the substrate support are positioned, and a second compartment in which a target of the PVD apparatus is positioned; and simultaneously maintaining a first plasma in the first compartment to remove material from the electrically conductive feature and a second plasma in the second compartment to clean the target.

The first plasma can be generated by applying an RF electrical signal to the substrate support.

The second plasma can be generated by applying an electrical signal to the target. The electrical signal applied to the target can be a DC electrical signal.

The material which is removed from the electrically conductive feature can be an oxide of a material that the electrically conductive feature is formed from. The electrically conductive feature can be formed from aluminium. The material which is removed from the electrically conductive feature can be aluminium oxide.

The aluminium electrically conductive feature can be a bond pad for the semiconductor substrate.

The electrically conductive feature can be formed from copper. The material which is removed from the copper electrically conductive feature can be one or more of titanium, tantalum, a nitride of titanium or a nitride of tantalum.

The copper electrically conductive feature can be a constituent of a Damascene interconnection.

In general, the material which is removed from the electrically conductive feature can be a relatively electrically resistive material where removal of the relatively electrically resistive layer is desirable to improve a contact resistance.

The step of deploying the shutter within the chamber can comprise moving the shutter laterally across the chamber from a storage position to a deployment position. In the deployment position the chamber is divided into the first and second compartments. The use of other types of shutter can be contemplated, such as shutters which are rotated into a deployment position.

The substrate and the shutter can be separated by a gap in the range 35 to 60 mm during the step of simultaneously maintaining the first and second plasmas.

The shutter can be fabricated from titanium or aluminium.

The method can comprise the further steps of:

retracting the shutter so that the chamber is no longer divided into the first and second compartments; and operating the PVD apparatus to deposit an electrically conductive deposition material onto the electrically conductive feature by PVD.

The substrate support can be at a first position during the step of simultaneously maintaining the first and second plasmas and at a second position during the step of operating the PVD apparatus to deposit an electrically conductive deposition material onto the electrically conductive feature by PVD, wherein the second position is closer to the target than the first position.

The electrically conductive deposition material deposited onto the electrically conductive feature by PVD can be titanium. Alternatively, the electrically conductive deposition material deposited onto the electrically conductive feature by PVD can be chromium, TiW, copper, nickel or palladium.

The deposition of the electrically conductive deposition material onto the electrically conductive feature by PVD can be part of an Under Bump Metallization (UBM) process.

The semiconductor substrate can be a silicon substrate, such as a silicon wafer.

The semiconductor substrate can be in the form of one or more integrated circuits.

According to a second aspect of the invention there is provided a PVD apparatus capable of operating in a cleaning mode comprising:

a chamber comprising a substrate support and a target;

a shutter which can be deployed within the chamber when, in use, a semiconductor substrate with an electrically conductive feature formed thereon is positioned on the substrate support, the shutter being deployed to divide the chamber into a first compartment in which the substrate support is positioned, and a second compartment in which the target is positioned;

a first plasma generation device for maintaining a first plasma in the first compartment to remove material from the electrically conductive feature;

a second plasma generation device for maintaining a second plasma in the second compartment to clean the target; and a controller configured to control the apparatus in use (i) to deploy the shutter and (ii) to simultaneously maintain a first plasma in the first compartment to remove material from the electrically conductive feature and a second plasma in the second compartment to clean the target.

The controller and the substrate support can be configured so that the substrate support is at a first position during the step of simultaneously maintaining the first and second plasmas and at a second position during the step of operating the PVD apparatus to deposit an electrically conductive deposition material onto the electrically conductive feature by PVD, wherein the second position is closer to the target than the first position.

The PVD apparatus can further comprise an anode structure that substantially or completely surrounds the target, wherein the second plasma is generated between the target and the anode structure.

The shutter can be stored in a storage position which is outside of the chamber. The apparatus can further comprise a device for moving the shutter laterally across the chamber from the storage position to a deployment position in which the shutter is deployed, and retracting the shutter to the storage position.

The shutter can be electrically grounded at least when it is deployed.

The controller can be configured to control a position of the substrate support so that the substrate and the shutter are separated by a gap in the range 35 to 60 mm while the first and second plasmas are simultaneously maintained.

The shutter can be sized to provide an annular gap between the shutter and the inner wall of the chamber which enables both upper and lower compartments to be pumped efficiently and conveniently. Additionally, the provision of the gap has the beneficial effect that any advantages associated with the cleaning plasma in the upper compartment are also conferred on the lower compartment. For example, particulates in the lower compartment can be controlled through gettering and pasting with material sputtered from the target.

In general, a magnetron assembly is disposed behind the target, as is well known to the skilled reader.

For the avoidance of doubt, whenever reference is made herein to 'comprising' or 'including' and like terms, the invention is also understood to include more limiting terms such as 'consisting' and 'consisting essentially'.

Whilst the invention has been described above, it extends to any inventive combination of the features set out above, or in the following description, drawings or claims. For the avoidance of doubt, the apparatus of the second aspect of the invention is intended to be able to perform the method of the first aspect of the invention. Therefore, any features disclosed in relation to the first aspect of the invention may be combined with any features disclosed in relation to the second aspect of the invention and vice versa.

DESCRIPTION OF THE DRAWINGS

Embodiments of the invention will now be described, by way of example only, with reference to the accompanying drawings, in which:

FIG. 4a is a schematic diagram of a PVD apparatus of the invention with simultaneous plasmas in lower and upper compartments of the chamber and 4b during PVD deposition;

FIG. 5 shows a prior art Ti deposition process flow;

FIG. 6 shows a sequential pre-clean/Ti deposition process flow;

DETAILED DESCRIPTION OF THE DISCLOSURE

Figure 1:
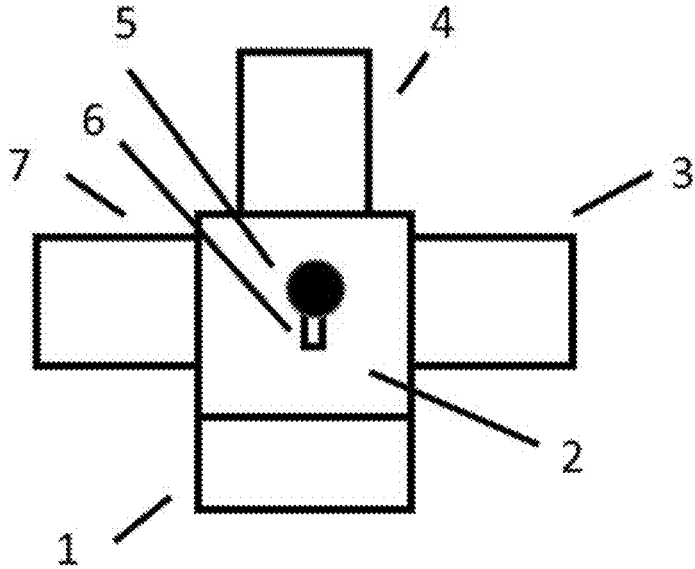
FIG. 1 is a schematic diagram of a prior art PVD cluster tool.

FIG. 4 shows a PVD apparatus of the invention which is capable of operating in a cleaning mode to remove material from an electrically conductive feature formed on a semiconductor substrate. The apparatus comprises a chamber 40 comprising a substrate support 41, such as a platen, and a target 42. The apparatus further comprises a shutter 43. The shutter 43 is stored in a storage position in a recess in the chamber 40. The shutter 43 can be deployed within the chamber 40 by way of being directly driven in a horizontal direction by a piston or other suitable actuator (not shown). The shutter is deployed to divide the chamber into a first, lower, compartment 44 in which the substrate support is positioned, and a second, upper, compartment 45 in which the target is positioned. As explained in more detail below, the shutter 43 is deployed after a semiconductor substrate 46 having an electrically conductive feature formed thereon is positioned on the substrate support 41. An RF power supply 47 supplies an RF power to the substrate support 41 to generate and maintain a first plasma in the first compartment 44 to remove material from the electrically conductive feature. A DC power supply (not shown) is used to supply DC power to the target 42 to generate and maintain a second plasma in the second compartment 45 to clean the target 42. The DC power supply is also used to generate and maintain a plasma during PVD deposition. A controller 48 is provided which is configured to control the apparatus in use (i) to deploy the shutter and (ii) to simultaneously maintain the first plasma in the first compartment and the second plasma in the second compartment.

Controller 48 typically comprises a programmable processor, which is programmed in software and/or firmware to carry out the functions that are described herein, along with suitable digital and/or analog interfaces for connection to the other elements of system. Alternatively or additionally, controller 48 comprises hard-wired and/or programmable hardware logic circuits, which carry out at least some of the functions of the controller 48. Although controller 48 is shown in FIGS. 4a-4b, for the sake of simplicity, as a single, monolithic functional block, in practice the controller 48 may comprise multiple, interconnected control units, with suitable interfaces for receiving and outputting the signals that are illustrated in the figures and are described herein. Program code or instructions for the controller 48 to implement various methods and functions disclosed herein may be stored in readable storage media, such as a memory in the controller 48 or other memory.

The apparatus can be used to isolate an upper portion of the chamber from a lower portion by deploying the shutter 43. This allows a target cleaning process to take place while simultaneously a semiconductor substrate 46 such as a wafer is present on the substrate support 41. This wafer is effectively shielded from the target allowing a secondary process to be performed on it in the lower portion of the chamber while at the same time the upper section is active. A gap of a few cm between the wafer and the shutter has been found to provide excellent results by allowing a uniform plasma to be sustained above the wafer support. Typically, the shutter is grounded while the first and second plasmas are maintained. The shutter can be of a type used in the Applicant's Sigma fxP™ PVD system with Advanced Hi-Fill™ module. Further details can be found in U.S. Pat. No. 6,929,724 B2. This shutter provides an annular gap between the shutter and the inner wall of the chamber which enables both compartments to be pumped efficiently and conveniently. Additionally, the provision of the gap has the beneficial effect that any advantages associated with the cleaning plasma in the upper compartment are also conferred on the lower compartment. For example, particulates in the lower compartment can be controlled through gettering and pasting with material sputtered from the target.

The plasma in the upper compartment 45 is a DC discharge plasma formed by applying a DC power to the target. The plasma conditions can be the same or similar to those used during the subsequent PVD deposition process. The plasma in the lower compartment 44 is an RF powered plasma generated by applying the RF power to the substrate support. Etching of the wafer is driven by the self-bias generated on the wafer.

Figures 2A, 2B:
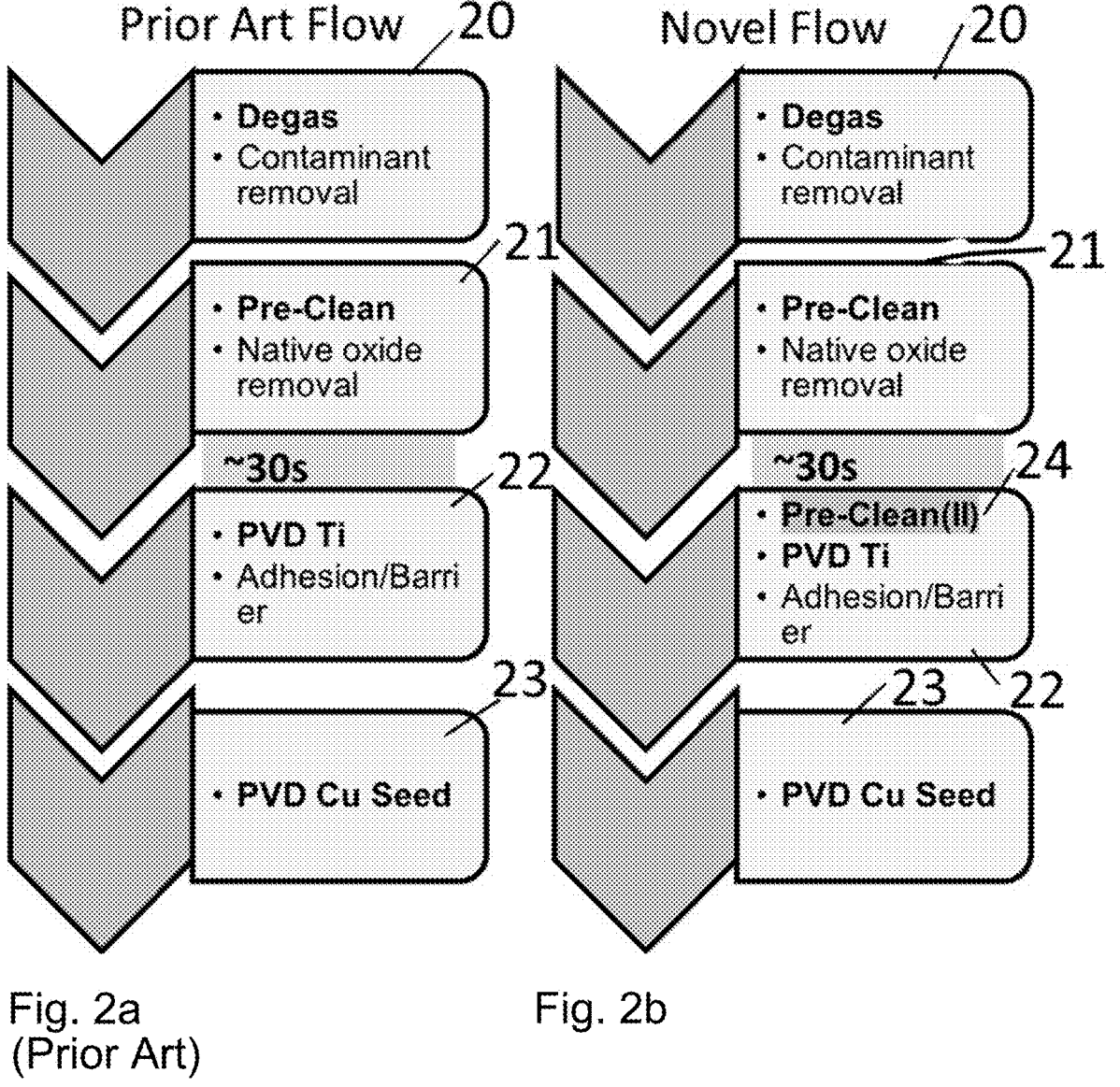
FIG. 2a shows a prior art process flow and 2b a process flow of the invention.
Figure 3:
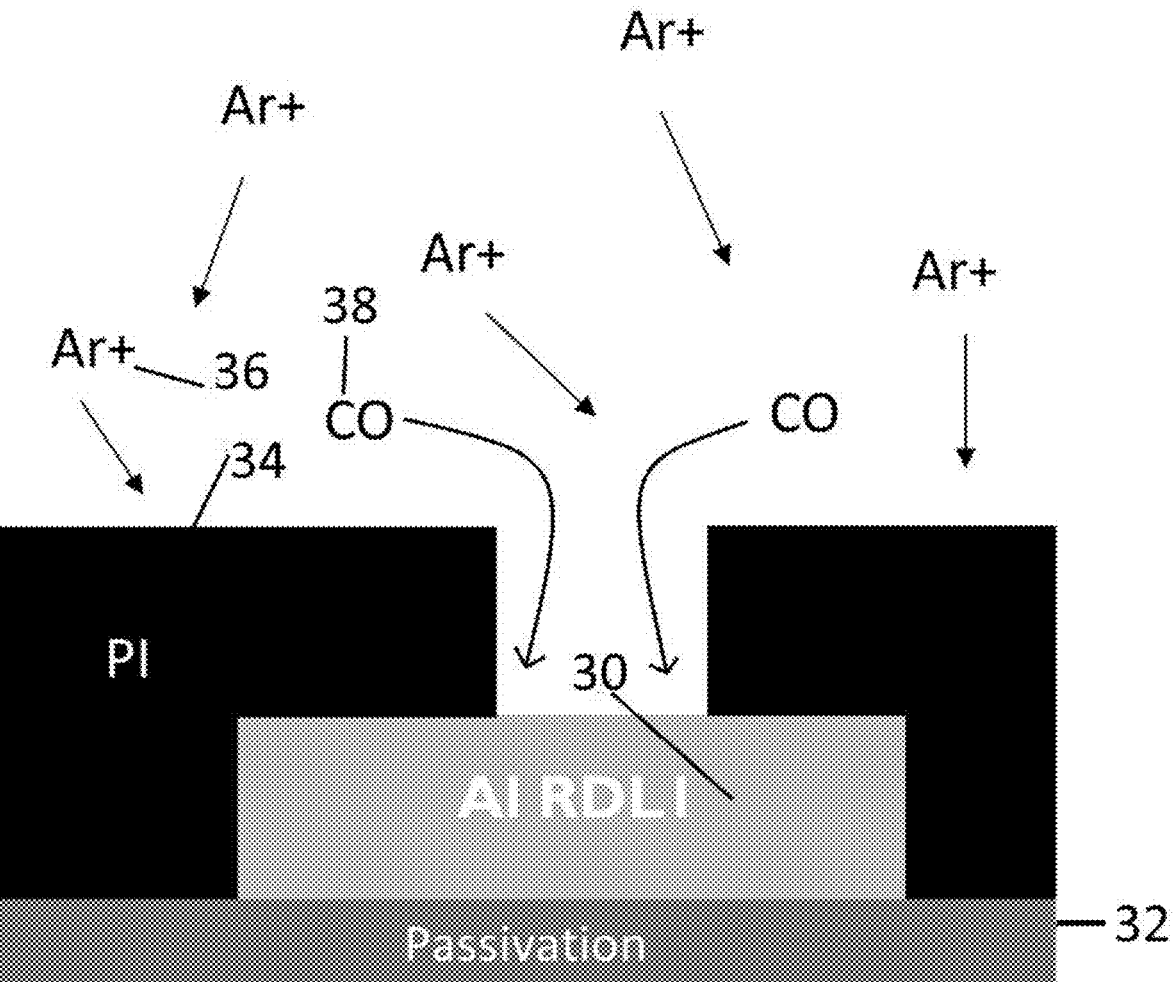
FIG. 3 is a schematic representation of an Al pad opening in a polyimide dielectric mask during argon ion etch clean.

The wafer can be etched when in the lower portion of the chamber using the configuration shown in FIG. 4a. It is advantageous that the PVD deposition configuration shown in FIG. 4b can then be immediately adopted. This greatly reduces the time between exposure of Al pads and Ti capping compared to traditional process flow where multiple seconds pass during transfer from etch to deposition chamber. FIG. 2(b) shows the associated process flow, which gives a reduction in the time between etch and deposition. The same numerals as used in FIG. 2a are used to denote common steps. FIG. 2(b) includes the additional sequence step 24 comprising the simultaneous substrate pre-clean (sputter etch) and target clean. This is followed by the PVD deposition 22 of the titanium adhesion/barrier layer, which is then followed by PVD deposition 23 of the copper seed layer. This process provides less time for the oxide interface to regrow and thereby provides a reduction in contact resistance.

The deployment of the shutter in this way allows the surface of the target to be shielded directly from materials etched from the wafer surface. However, the inventors have realized that diffusion of some contaminants to the target can occur as the upper and lower compartments are not completely isolated from one another. Accordingly, the inventors have determined that it is necessary to maintain a plasma in the upper compartment at the same time as the lower compartment. In this way, the plasma in the upper compartment cleans the target while the wafer is etched. A further advantage is the provision of excellent pumping conditions due to the natural gettering effect of titanium. A further advantage still is that titanium is pasted onto the shielding and the chamber walls. This helps to control particle build-up by pasting particles onto the interior surfaces of the apparatus, thereby preventing particles from dropping onto the wafer surface.

A standard prior art process sequence for Ti deposition following pre-cleaning of the Al bondpad in another chamber is shown in FIG. 5. The pre-cleaned wafer is transported under vacuum by a robot to the PVD module and placed onto the wafer support in step 101. The platen assembly is raised to the deposition height in step 102. This height will depend on process requirements but will typically be 2-6 cm. The chamber is brought to process pressure when gas such as Ar is introduced into the chamber at 103 and the Ti sputtering step starts at 104 when DC power (4-20 kW typically) is applied to the Ti target which will have a rotating magnetron assembly behind it. When the required film thickness is achieved DC power to the target is removed and Ar gas flow is stopped at step 105. The platen/wafer support is then lowered to the handling height in 106 while in 107 the vacuum robot removes the wafer from the platen and move the wafer to the next process station. As noted previously, these prior art processes suffer the severe drawback that, in the time it has taken for the wafer to be handled into the chamber, an oxide interface will have regrown on the surface.

A process sequence for operation of the apparatus of FIG. 4 is presented in FIG. 6. After handling the wafer onto the platen at 201 the shutter is deployed over the wafer in 202. The platen is then raised in 203 to the sputter etch process height which typically corresponds to a wafer to shutter gap of ~35-60 mm. In 204 Ar or another noble gas such as Kr or Xe is used to bring the chamber to process pressure. With the Ti target running in 206 an RF discharge is struck between the wafer support and the grounded shutter. This enables the wafer to be sputter cleaned while the partial pressure of oxidants is maintained at reduced levels. This step 1 (wafer clean/target plasma) cycle is stopped when it is determined that the oxide layer (which is typically 1-3 nm thick) has been removed from the Al contact at 207/208. The shutter is removed at 209 and the platen support is raised closer to the target at 210 in preparation for the Ti deposition step in 211. As Ar is still flowing at this stage deposition is initiated by switching the DC power, typically 4-20 kW, onto the target. When the required thickness of Ti has been deposited onto the wafer, target power and gas flow is turned off at 212 and the platen lowered to handling height at 213. Finally at 214 the wafer removed from the PVD module by the vacuum robot.

Due to the very short time of transfer from etch position to deposition position the amount of oxide regrowth that can occur from polymer breakdown is greatly reduced.

Figure 7:
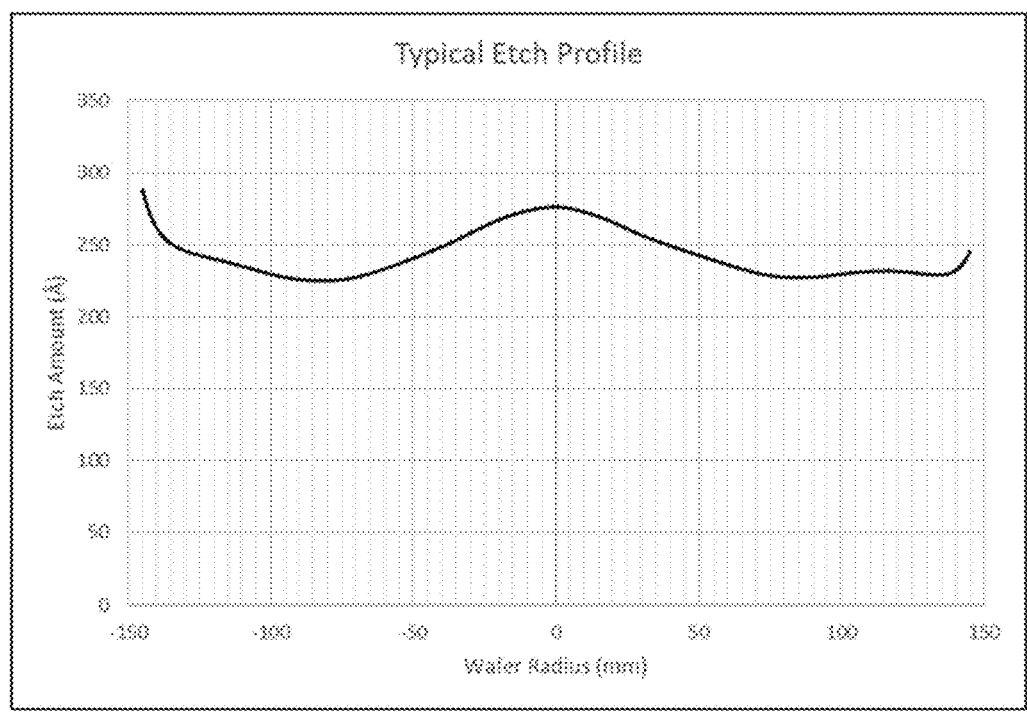
FIG. 7 shows an Ar sputter etch profile using the shutter.

Experiments were performed on SiO2 coated Si wafers and on Si wafers having Al and Ti features. FIG. 7 shows the etch profile of a SiO2 layer across a 300 mm Si wafer using a nominal shutter to wafer gap of 40 mm, with a 100 sccm flow of Ar, operating at 3.7 mTorr with 500 W RF (13.56 MHz) producing a DC bias of 345V.

Figure 8:
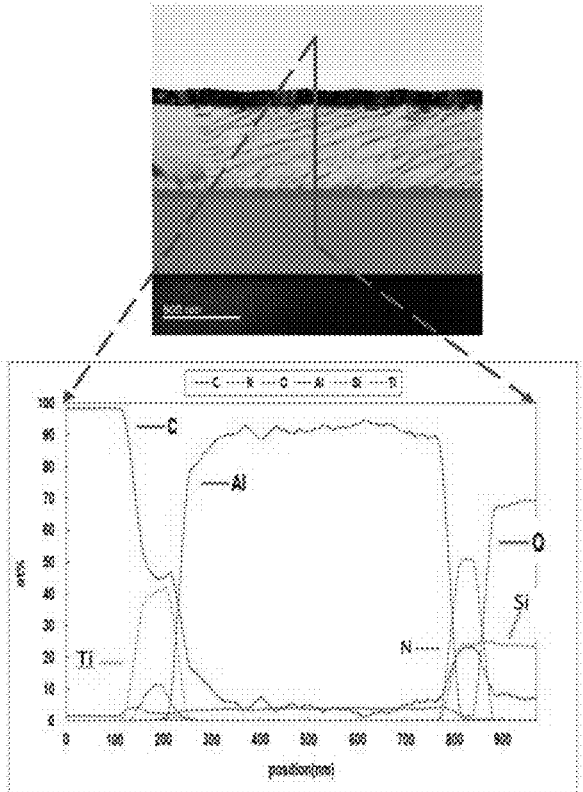
FIG. 8 shows EDAX (Energy Dispersive X-ray Analysis) measurements on Al/Ti structures manufactured in accordance with the invention.
Figure 9:
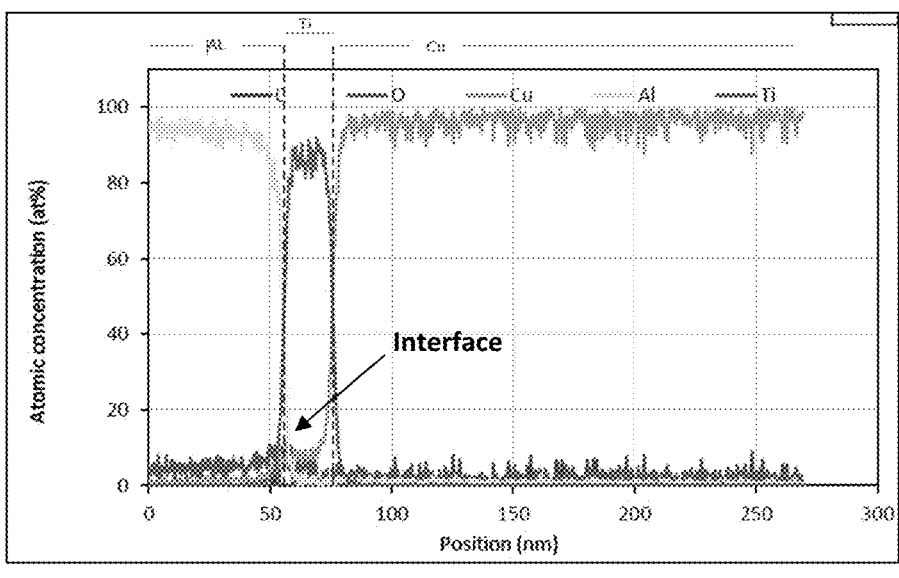
FIG. 9 shows EDAX measurements on Al/Ti structures manufactured in accordance with prior art techniques.

EDAX measurements suggest that there is no increase in oxygen signal at the Al—Ti interface using the process of the invention (FIG. 8) as opposed to data obtained from the standard prior art process, in which an increase in oxygen signal at the interface is observed (FIG. 9). Typically, with a standard prior art process this observed signal corresponds to 1-2 nm of oxide interface as determined by TEM.

Figure 10A:
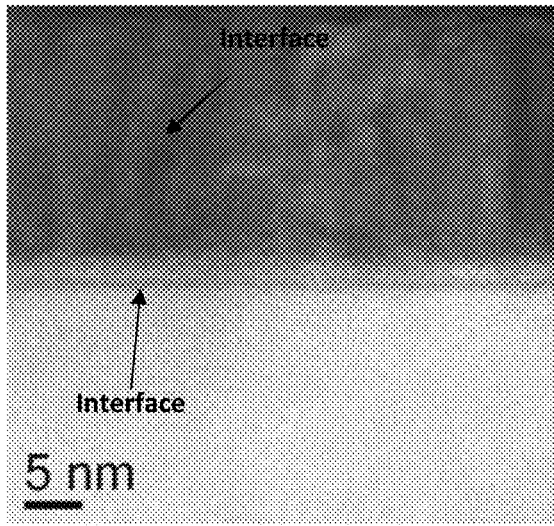
FIG. 10a is a TEM (Transmission Electron Microscope) image of Al/Ti structures manufactured in accordance with prior art techniques and 10b is a TEM image of Al/Ti structures manufactured in accordance with the invention.
Figure 10B:
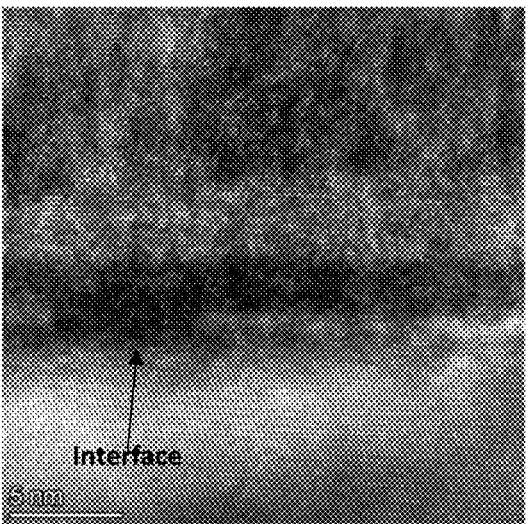

TEM imaging (FIG. 10a-10b) also suggests that the oxide interface is removed using the process of the invention.

Typical but non-limiting process conditions for the etch clean and deposition steps for 300 mm wafers are presented in Table 1.

TABLE 1

Exemplary etch clean and deposition conditions.

| Parameter | Units | Typical | Preferred |
|---|---|---|---|
| Etch Process | | | |
| Ar Gas | sccm | 50-200 | 100 |
| Pressure | mT | 1-15 | 3.6 |
| Platen RF Power | W | 50-600 | 500 |
| DC Bias | V | 30-400 | 350 |
| Shutter to wafer | mm | 35-60 | 40 |
| Deposition Process | | | |
| Ar Gas | sccm | 50-200 | 100 |
| Pressure | mT | 2-4 | 3 |
| Target Power | kW | 2-8 | 4 |
| Target Voltage | V | 350-400 | 380 |
| Target Current | A | 5-20 | 10 |
| DC Bias | V | 10-20 | 14 |
| Target to wafer | mm | 56-65 | 57.5 |

Figure 11:
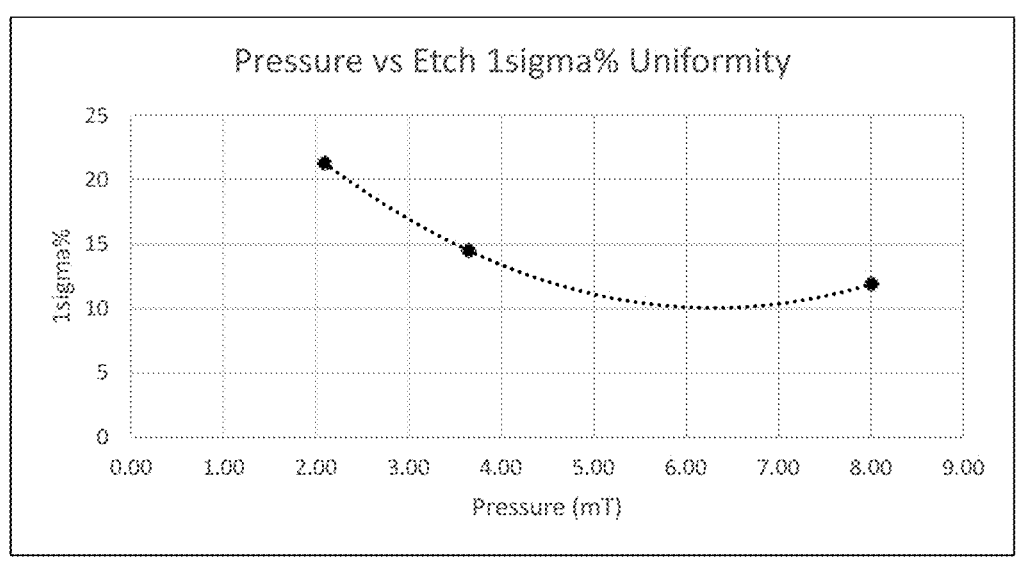
FIG. 11 shows etch uniformity for etch cleaning a silicon oxide coated silicon wafer as a function of process pressure.
Figure 12:
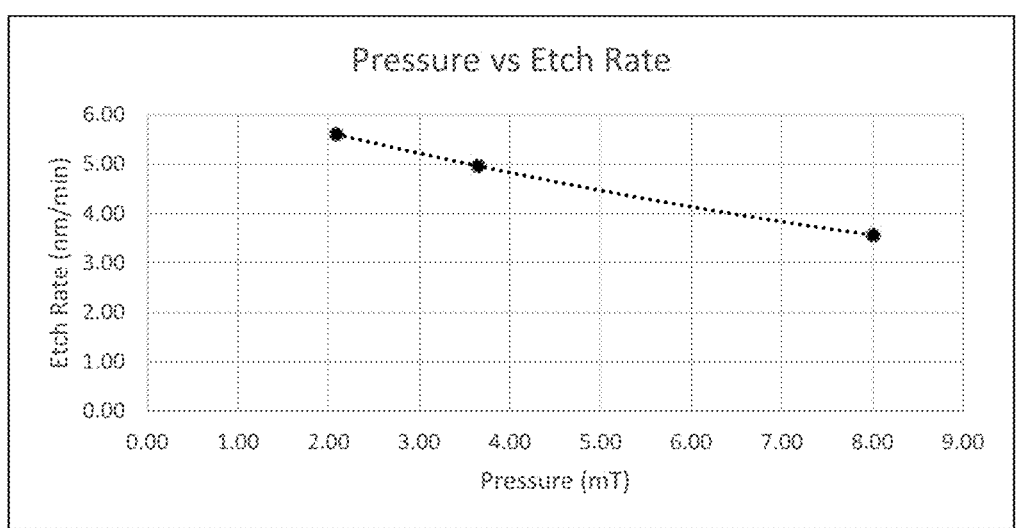
FIG. 12 shows etch rate for etch cleaning a silicon oxide coated silicon wafer as a function of process pressure.

FIGS. 11 and 12 show, respectively, etch uniformity and etch rate for etch cleaning a SiO2 coated Si wafer as a function of process pressure. These results were obtained using a wafer to shutter separation of 45 mm, and operating at 500 W RF power (13.56 MHz) with a 300 mm platen. For these tests a shutter made from aluminium was used. However, other materials, such as titanium, could also be used.

Figure 13:
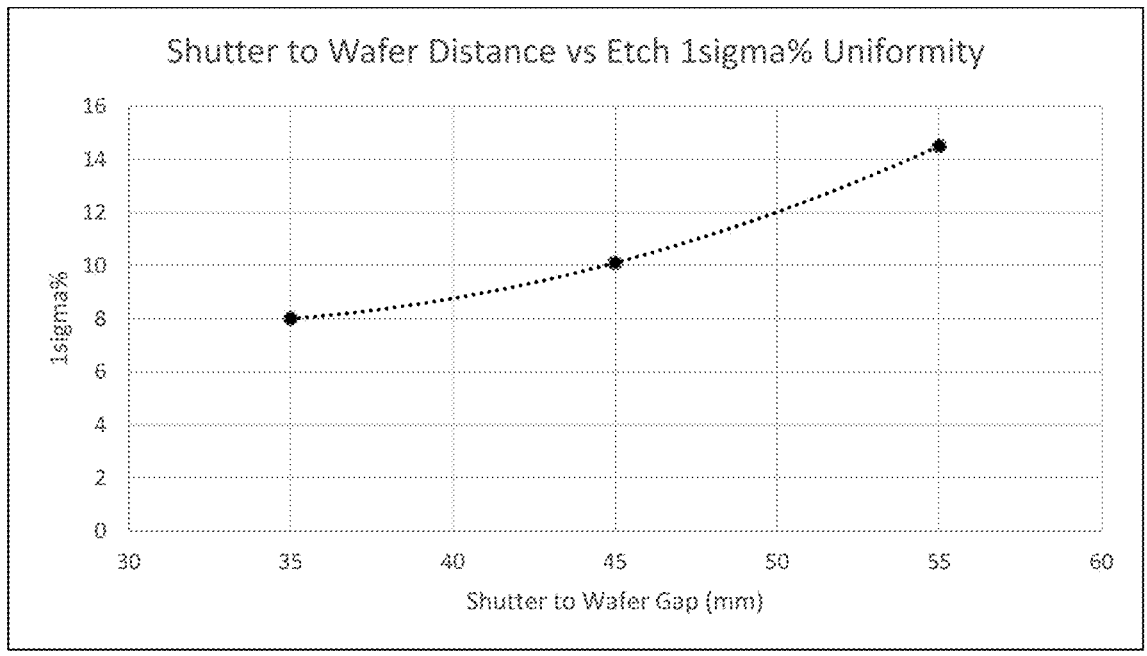
FIG. 13 shows etch uniformity for etch cleaning a silicon oxide coated silicon wafer as a function of wafer to shutter gap.

FIG. 13 shows etch uniformity as a function of wafer to shutter gap over the range 35-55 mm operating at 3.6 mTorr and with the same RF bias power of 500 W. These results indicate that etch rates and uniformity which are at least acceptable can be achieved over at least the range studied.

Furthermore, our results demonstrate that the invention can substantially reduce or even fully remove the metal oxide layer between Al and a Ti layer. This is achieved by conducting a sputter clean in the deposition module with the shutter above the wafer and reducing the oxidizing partial pressure post final sputter etch while reducing the time between the etch step and Ti deposition commencing. The results presented above were obtained using a "paddle" based shutter in a PVD chamber. However, the use of other types of shutter can be contemplated, such as shutters which are rotated into a deployment position. A shutter of this type is described in US 2019/0348264 A1.

The present invention can be readily incorporated into HVM (high volume manufacturing). This can be done in a cluster tool using a process sequence in which an initial sputter etch step is performed in a dedicated sputter etch module on the cluster tool and then a final pre-clean is carried out in the deposition module for reasons of productivity. However, it would also be practical to use a deposition module for both a complete pre-clean and a deposition step. In this way, it is possible to avoid using a pre-clean module at all.

Although the invention has been exemplified in relation to the removal of aluminium oxide from an aluminium feature prior to PVD deposition of titanium, the invention can be applied to other metallization applications where removal of a resistive layer is desired to reduce contact resistance.

The invention claimed is:

1. A method of operating a PVD apparatus in a cleaning mode to remove material from an electrically conductive feature formed on a semiconductor substrate comprising the steps of:

positioning the semiconductor substrate with the electrically conductive feature formed thereon on a substrate support in a chamber of the PVD apparatus, wherein the chamber is grounded;

deploying a shutter within the chamber to divide the chamber into a first compartment in which the semiconductor substrate and the substrate support are positioned, and a second compartment in which a target of the PVD apparatus is positioned; and simultaneously maintaining a first plasma in the first compartment to remove material from the electrically conductive feature and a second plasma in the second compartment to clean the target, wherein the first plasma is generated by applying an RF electrical signal to the substrate support and the second plasma is generated by applying a DC electrical signal to the target, and wherein fields in the chamber are only produced by the RF electrical signal to the substrate support and the DC electrical signal to the target.

2. The method according to claim 1 in which the material which is removed from the electrically conductive feature is an oxide of a material that the electrically conductive feature is formed from.

3. The method according to claim 2 in which the electrically conductive feature is formed from aluminium and the material which is removed from the electrically conductive feature is aluminium oxide.

4. The method according to claim 3 in which the electrically conductive feature is a bond pad for the semiconductor substrate.

5. The method according to claim 1 in which the electrically conductive feature is formed from copper.

6. The method according to claim 5 in which the material which is removed from the electrically conductive feature is one or more of titanium, tantalum, a nitride of titanium or a nitride of tantalum.

7. The method according to claim 5 in which the electrically conductive feature is a constituent of a Damascene interconnection.

8. The method according to claim 1 in which deploying the shutter within the chamber comprises moving the shutter laterally across the chamber from a storage position to a deployment position whereby the chamber is divided into the first and second compartments.

9. The method according to claim 1 in which the substrate and the shutter are separated by a gap in the range 35 to 60 mm while simultaneously maintaining of the first plasma and the second plasma.

10. The method according to claim 1 in which the shutter is fabricated from titanium or aluminium.

11. A method according to claim 1 comprising the further steps of:

retracting the shutter so that the chamber is no longer divided into the first and second compartments; and operating the PVD apparatus to deposit an electrically conductive deposition material onto the electrically conductive feature by PVD.

12. The method according to claim 11 in which the substrate support is at a first position while simultaneously maintaining the first plasma and the second plasma and at a second position while operating the PVD apparatus to deposit the electrically conductive deposition material onto the electrically conductive feature by PVD, wherein the second position is closer to the target than the first position.

13. The method according to claim 11 in which the electrically conductive deposition material deposited onto the electrically conductive feature by PVD is titanium.

14. The method according to claim 11 in which the deposition of the electrically conductive deposition material onto the electrically conductive feature by PVD is part of an Under Bump Metallization (UBM) process.

15. A PVD apparatus capable of operating in a cleaning mode comprising:

a chamber comprising a substrate support and a target, wherein the chamber is grounded;

a shutter configured to be deployed within the chamber when, in use, a semiconductor substrate with an electrically conductive feature formed thereon is positioned on the substrate support, the shutter being deployed to divide the chamber into a first compartment in which the substrate support is positioned, and a second compartment in which the target is positioned;

a first plasma generation device for maintaining a first plasma in the first compartment to remove material from the electrically conductive feature, wherein the first plasma generation device applies an RF electrical signal to the substrate support;

a second plasma generation device for maintaining a second plasma in the second compartment to clean the target, wherein the second plasma generation device applies a DC electrical signal to the target; and a controller configured to control the apparatus in use (i) to deploy the shutter and (ii) to simultaneously maintain a first plasma in the first compartment to remove material from the electrically conductive feature and a second plasma in the second compartment to clean the target, and wherein fields in the chamber are only produced by the RF electrical signal to the substrate support and the DC electrical signal to the target.

16. The PVD apparatus according to claim 15 in which the controller and the substrate support are configured so that the substrate support is at a first position while simultaneously maintaining the first plasma and the second plasma and at a second position while operating the PVD apparatus to deposit an electrically conductive deposition material onto the electrically conductive feature by PVD, wherein the second position is closer to the target than the first position.

17. The PVD apparatus according to claim 15 further comprising an anode structure that substantially or completely surrounds the target, wherein the second plasma is generated between the target and the anode structure.

18. The PVD apparatus according to claim 15 in which the shutter is stored in a storage position which is outside of the chamber.

19. The PVD apparatus according to claim 18 further comprising a device for moving the shutter laterally across the chamber from the storage position to a deployment position in which the shutter is deployed, and retracting the shutter to the storage position.

20. The PVD apparatus according to claim 15 in which the shutter is electrically grounded at least when it is deployed.

21. The PVD apparatus according to claim 15 in which the controller is configured to control a position of the substrate support so that the substrate and the shutter are separated by a gap in the range 35 to 60 mm while the first and second plasmas are simultaneously maintained.

\* \* \* \* \*